US012733356B2

(12) United States Patent
Lee et al.

(10) Patent No.: US 12,733,356 B2
(45) Date of Patent: Sep. 8, 2026

(54) LIGHT EMITTING DISPLAY APPARATUS WITH REDUCED NON-DISPLAY AREA

(71) Applicant: LG Display Co., Ltd., Seoul (KR)

(72) Inventors: KwonHyung Lee, Paju-si (KR); DaeYun Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 788 days.

(21) Appl. No.: 17/978,012

(22) Filed: Oct. 31, 2022

(65) Prior Publication Data

US 2023/0217746 A1 Jul. 6, 2023

(30) Foreign Application Priority Data

Dec. 31, 2021 (KR) ........................ 10-2021-0194748

(51) Int. Cl.
*H10K 59/131* (2023.01)

(52) U.S. Cl.
CPC .................................. *H10K 59/131* (2023.02)

(58) Field of Classification Search
CPC ...... H10K 59/131; H10K 77/10; H10K 59/18; G09G 2300/026; G09G 2300/0426; H01L 25/167; H01L 25/0753; H01L 23/49816; H01L 23/49838; H10H 20/857; G09F 9/33; H10D 86/451; H10D 86/441
USPC ............................................................ 257/40
See application file for complete search history.

(56) References Cited

U.S. PATENT DOCUMENTS 4,183,629 A * 1/1980 Nishimura .......... G02F 1/13452 349/149
2003/0201331 A1* 10/2003 Finkelstein ............ B42D 25/00 235/487
2020/0051966 A1 2/2020 Lee et al.
2021/0202630 A1 7/2021 Jeon et al.
2021/0202686 A1* 7/2021 Jeon ....................... H10K 50/19
2021/0202906 A1 7/2021 Kim et al.
2021/0366378 A1* 11/2021 Zhao ....................... G09F 9/302

FOREIGN PATENT DOCUMENTS

CN 113130598 A 7/2021
CN 113130604 A 7/2021
EP 3343273 A2 7/2018
EP 3343274 A2 7/2018

(Continued)

*Primary Examiner* — Mohammad M Hoque
(74) *Attorney, Agent, or Firm* — Seed Intellectual Property Law Group LLP

(57) ABSTRACT

A light emitting display apparatus includes a first base substrate including a first pad portion including a first pad connected to a routing line, a display area, and a first boundary region provided between the display area and the first pad portion and a second base substrate including a second pad portion including a second pad connected to the routing line, a connection region where a link line is provided, and a second boundary region provided between the connection region and the second pad portion. The second base substrate is bonded to a rear surface of the first base substrate, a thickness of the first base substrate in the first pad portion is less than a thickness of the first base substrate in the first boundary region, and a thickness of the second base substrate in the second pad portion is less than a thickness of the second base substrate in the second boundary region.

18 Claims, 8 Drawing Sheets

(56) References Cited

FOREIGN PATENT DOCUMENTS

| | | | |
|---|---|---|---|
| JP | 2003124773 | A | 4/2003 |
| JP | 2020088066 | A | 6/2020 |
| KR | 10-2021-0086025 | A | 7/2021 |
| KR | 20210111529 | A | 9/2021 |

* cited by examiner

D1
D2
191
691
S1a
S1b
N
Q
800
101
710
710
601
800
195
194
193
192
190
191
100
691
690
692
695
600

LIGHT EMITTING DISPLAY APPARATUS WITH REDUCED NON-DISPLAY AREA

CROSS-REFERENCE TO RELATED APPLICATIONS

This application claims the benefit of the Korean Patent Application No. 10-2021-0194748 filed on Dec. 31, 2021, which is hereby incorporated by reference as if fully set forth herein.

BACKGROUND

Technical Field

The present disclosure relates to a light emitting display apparatus.

Description of the Related Art

A non-display area, which does not display an image, is provided at a border or an edge of a light emitting display panel.

In order to increase the immersion of a user, a width of the non-display area has been progressively reduced, and light emitting display panels including no non-display area have been proposed recently.

BRIEF SUMMARY

In order to manufacture light emitting display panels including no non-display area, routing lines for electrically connecting a first substrate, displaying an image, to a second substrate coupled to the first substrate and equipped with various drivers are provided on lateral surfaces of the first substrate and the second substrate.

Inventors recognize that if the routing lines protrude from a lateral surface, a flat surface, and a rear surface of a light emitting display panel, the routing lines may contact various structures, and due to this, the routing lines may be damaged.

The present disclosure provides a light emitting display apparatus that, among others, substantially obviates one or more problems due to limitations and disadvantages of the related art.

An aspect of the present disclosure is directed to providing a light emitting display apparatus in which a thickness of a base substrate in a pad portion, including pads connected to routing lines, is less than that of a base substrate in a region where a pad portion is not provided.

Additional advantages and features of the disclosure will be set forth in part in the description which follows and in part will become apparent to those having ordinary skill in the art upon examination of the following or may be learned from practice of the disclosure. The technical benefits and other advantages of the disclosure may be realized and attained by the structure pointed out in the written description and claims hereof as well as the appended drawings.

There is provided a light emitting display apparatus including a first base substrate including a first pad portion including a first pad connected to a routing line, a display area, and a first boundary region provided between the display area and the first pad portion and a second base substrate including a second pad portion including a second pad connected to the routing line, a connection region where a link line is provided, and a second boundary region provided between the connection region and the second pad portion, wherein the second base substrate is bonded to a rear surface of the first base substrate, a thickness of the first base substrate in the first pad portion is less than a thickness of the first base substrate in the first boundary region, and a thickness of the second base substrate in the second pad portion is less than a thickness of the second base substrate in the second boundary region.

It is to be understood that both the foregoing general description and the following detailed description of the present disclosure are examples and explanatory and are intended to provide further explanation of the disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
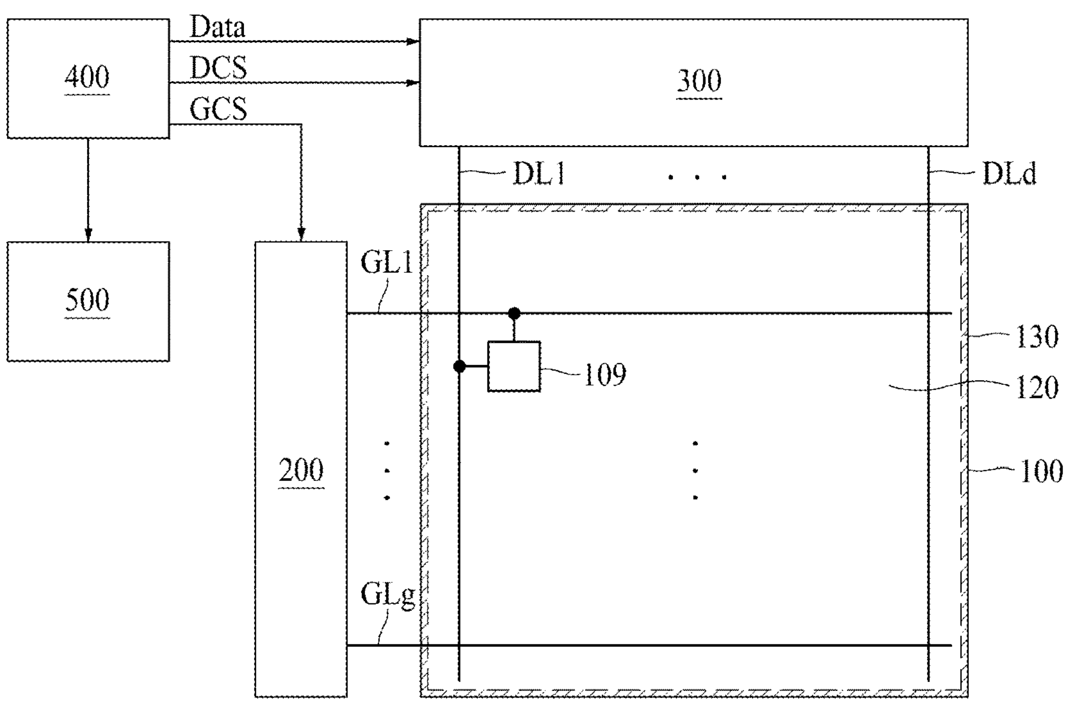
FIG. 1 is an example diagram illustrating a configuration of a light emitting display apparatus according to the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. When the expression that an element or a layer is "connected," "coupled," or "adhered" to another element or layer, the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
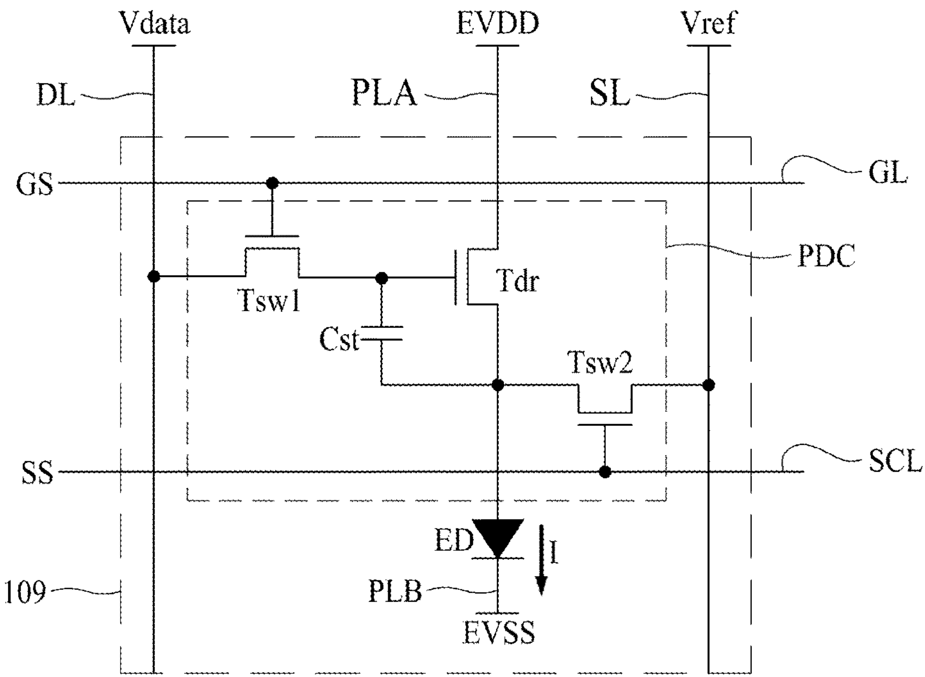
FIG. 2 is an example diagram illustrating a structure of a pixel applied to a light emitting display apparatus according to the present disclosure.

FIG. 1 is an example diagram illustrating a configuration of a light emitting display apparatus according to the present disclosure, and FIG. 2 is an example diagram illustrating a structure of a pixel applied to a light emitting display apparatus according to the present disclosure.

The light emitting display apparatus according to the present disclosure may be included in various electronic devices. The electronic devices may include, for example, smartphones, tablet personal computers (PCs), televisions (TVs), and monitors.

The light emitting display apparatus according to the present disclosure, as illustrated in FIG. 1, may include a light emitting display panel 100 which includes a display area 120, e.g., in a central region of light emitting display panel, for displaying an image and a non-display area 130 provided outside the display area 120, a gate driver 200 which supplies a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply 500 which supplies power to the controller, the gate driver, the data driver, and the light emitting display panel. Particularly, in the light emitting display apparatus according to the present disclosure, stages included in the gate driver 200 may be provided in the display area 120, and the gate lines GL1 to GLg connected to the stages may be provided in the light emitting display panel 100.

First, the light emitting display panel 100 may include the display area 120 and the non-display area 130.

A plurality of pixels 109 displaying an image may be provided in the display area 120, and the non-display area 130 may surround the display area 120.

As described above, because the gate driver 200 connected to gate lines are provided in the display area 120, a non-display area for the gate driver 200 may be omitted. Accordingly, a width of the non-display area 130 may be reduced compared to the related art.

The gate lines GL1 to GLg, the data lines DL1 to DLd, and the pixels 109 may be provided in the display area 120. Also, stages configuring the gate driver 200 may be provided in the display area 120. Accordingly, the display area 120 may display an image. Here, g and d may each be a natural number.

The pixel 109 included in the light emitting display panel 100, as illustrated in FIG. 2, may include an emission area which includes a pixel driving circuit PDC, including a switching transistor Tsw1, a storage capacitor Cst, a driving transistor Tdr, and a sensing transistor Tsw2, and a light emitting device ED.

A structure of the pixel 109 included in the light emitting display panel 100 is not limited to a structure illustrated in FIG. 2. A structure of the pixel 109 may be changed to various shapes.

Various insulation layers and electrodes configuring the pixels 109 may be provided on a first base substrate such as a glass substrate or a film. That is, the light emitting display panel 100 may include a first base substrate, a plurality of insulation layers provided on the first base substrate, and a plurality of electrodes provided on the first base substrate.

The data driver 300 may supply data voltages to the data lines.

The controller 400 may realign input video data transferred from an external system by using a timing synchronization signal transferred from the external system and may generate a data control signal DCS which is to be supplied to the data driver 300 and a gate control signal GCS which is to be supplied to the gate driver 200.

The controller 400 may include a data aligner which realigns input video data to generate image data Data and supplies the image data Data to the data driver 300, a control signal generator which generates the gate control signal GCS and the data control signal DCS by using the timing synchronization signal, an input unit which receives the timing synchronization signal and the input video data transferred from the external system and respectively transfers the timing synchronization signal and the input video data to the control signal generator and the data aligner, and an output unit which supplies the data driver 300 with the image data Data generated by the data aligner and the data control signal DCS generated by the control signal generator and supplies the gate driver 200 with the gate control signal GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In some embodiments, the image information may include input video information.

The power supply 500 may generate various powers and may supply the generated powers to the controller 400, the gate driver 200, the data driver 300, and the light emitting display panel 100.

The gate driver 200 may supply gate pulses to the gate lines GL1 to GLg. When the gate pulse generated by the gate driver 200 is supplied to the gate of the switching transistor Tsw1 included in the pixel 109, the switching transistor Tsw1 may be turned on. When the switching transistor Tsw1 is turned on, a data voltage supplied through a data line may be supplied to the pixel 109. When a gate-off signal generated by the gate driver 200 is supplied to the gate of the switching transistor Tsw1, the switching transistor Tsw1 may be turned off. When the switching transistor Tsw1 is turned off, a data voltage may not be supplied to the pixel 109 any longer. The gate signal GS supplied to the gate line GL may include the gate pulse and the gate-off signal.

The gate driver 200 may include a plurality of stages, and the stages may be connected to the gate lines GL1 to GLg.

The stages may be included in the light emitting display panel 100, and particularly, may be provided in the display area 120.

Figure 3:
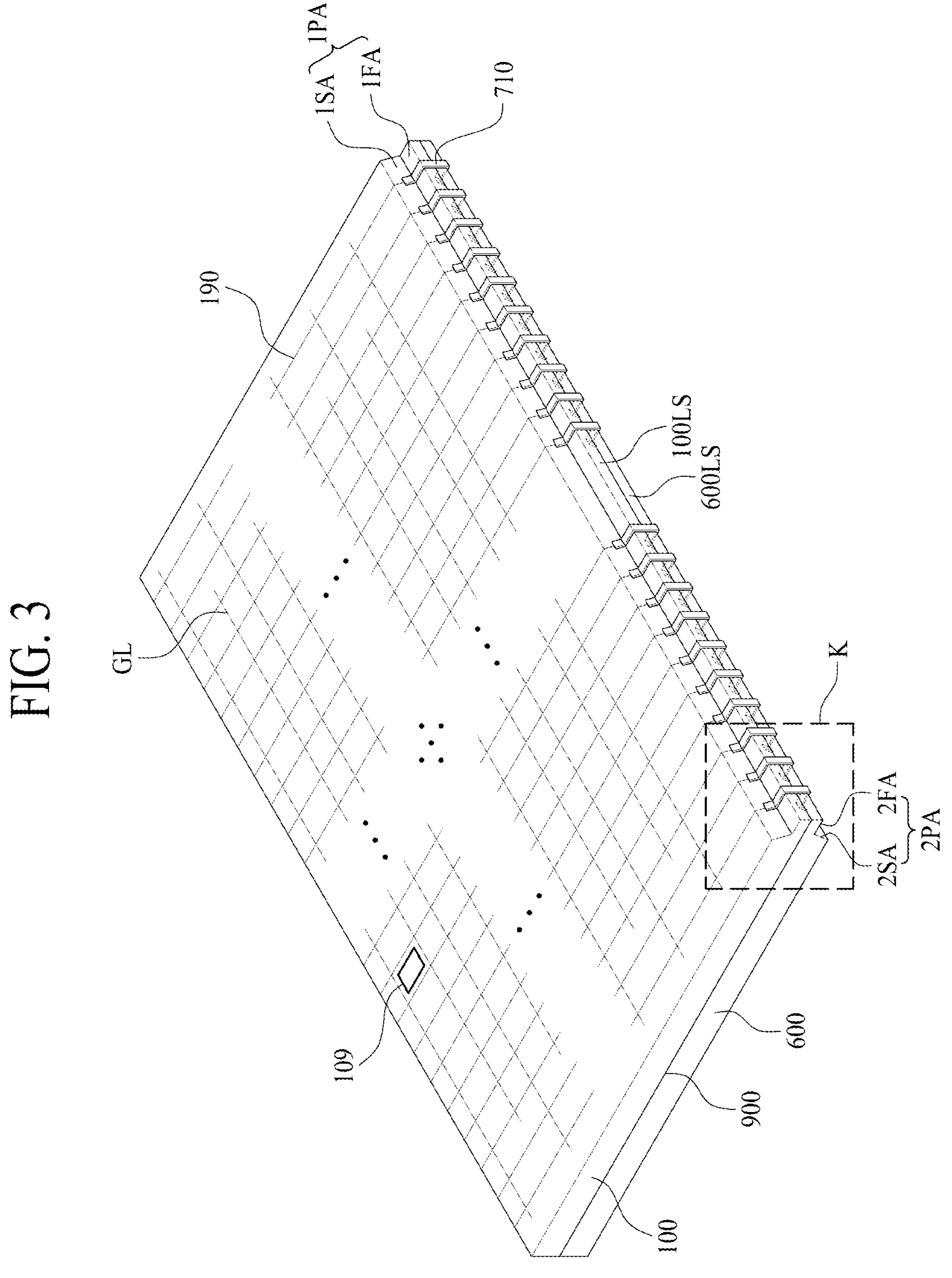
FIG. 3 is a perspective view illustrating a front surface of a light emitting display apparatus according to the present disclosure.
Figure 4:
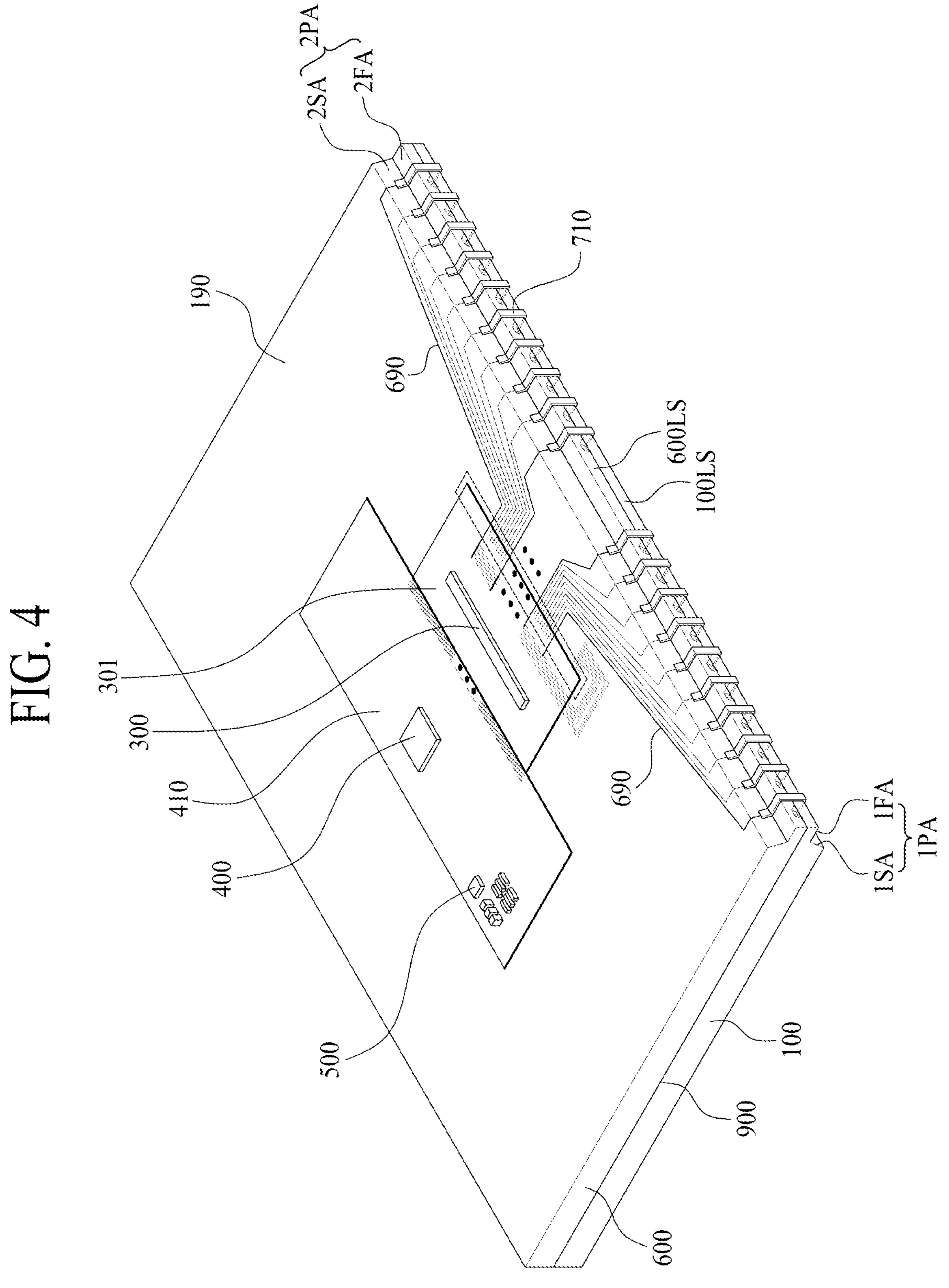
FIG. 4 is a perspective view illustrating a rear surface of a light emitting display apparatus according to the present disclosure.

FIG. 3 is a perspective view illustrating a front surface and a lateral surface of a light emitting display apparatus according to the present disclosure, and FIG. 4 is a perspective view illustrating a rear surface and a lateral surface of a light emitting display apparatus according to the present disclosure.

The light emitting display apparatus according to the present disclosure may include a first substrate 100, including pixels 109 and signal lines 190 arranged in a first direction, and a second substrate 600 which is disposed on a rear surface of the first substrate 100. The first substrate 100 may be bonded to the second substrate 600 by a coupling member 900.

The first substrate 100 may be the light emitting display panel 100 described herein with reference to FIGS. 1 and 2. In the following description, therefore, reference numeral “100” assigned to the light emitting display panel may be used as a reference numeral of the first substrate.

The signal lines 190 included in the first substrate 100 may include data lines DL1 to DLd which transfer data voltages to the pixels 109, power lines which transfer driving voltages to the pixels 109, gate clock lines which transfer gate clocks to a gate driver 200, and gate power lines which transfer gate driving voltages to the gate driver 200. The power lines may include a high voltage supply line PLA and a low voltage supply line PLB illustrated in FIG. 2. The signal lines 190 may include a sensing line SL illustrated in FIG. 2.

As illustrated in FIG. 3, in the first substrate 100, a first pad portion 1PA provided in a first lateral direction of the first substrate 100 may include first pads (e.g., first pad 101 in FIG. 6) which are connected to the signal lines 190 and the routing lines 710.

As illustrated in FIG. 4, in the second substrate 600, a second pad portion 2PA provided in the first lateral direction of the second substrate 600 may include second pads which are connected to the routing lines 710.

The routing lines 710 may be provided at a first lateral surface 100LS of the first substrate 100 and a first lateral surface 600LS of the second substrate 600.

That is, the routing lines 710 provided at the first lateral surface 100LS of the first substrate 100 and the first lateral surface 600LS of the second substrate 600 may extend to the first pad portion 1PA and may be connected to the first pads included in the first pad portion 1PA.

Moreover, the routing lines 710 provided at the first lateral surface 100LS of the first substrate 100 and the first lateral surface 600LS of the second substrate 600 may extend to the second pad portion 2PA and may be connected to the second pads included in the second pad portion 2PA.

Finally, as illustrated in FIG. 4, link lines 690 connected to the routing lines 710 and the second pads may be provided in the second substrate 600.

The link lines 690 may be connected to at least one driver. Some of the link lines 690 may be connected to a data driver 300, some of the link lines 690 may be connected to a controller 400, and some of the link lines 690 may be connected to a power supply 500.

For example, in FIG. 4, as an example of the present disclosure, a light emitting display apparatus is illustrated where the link lines 690 are connected to the data driver 300 through a first printed circuit board (PCB) 301 with the data driver mounted thereon and the first PCB 301 is connected to a second PCB 410 with the controller 400 mounted thereon.

In some embodiments, the power supply 500 may be mounted on the second PCB 410.

Moreover, some link lines 690 connected to the controller 400 and the power supply 500 among the link lines 690 may be connected to the controller 400 and the power supply 500 through the first PCB 301 and the second PCB 410.

To this end, lines connected to the link lines 690 may be provided on the first PCB 301 and the second PCB 410.

Hereinafter, a structure of a light emitting display apparatus (particularly, a structure of the first substrate 100) according to the present disclosure including elements described above will be described with reference to FIGS. 1 to 5.

Figure 5:
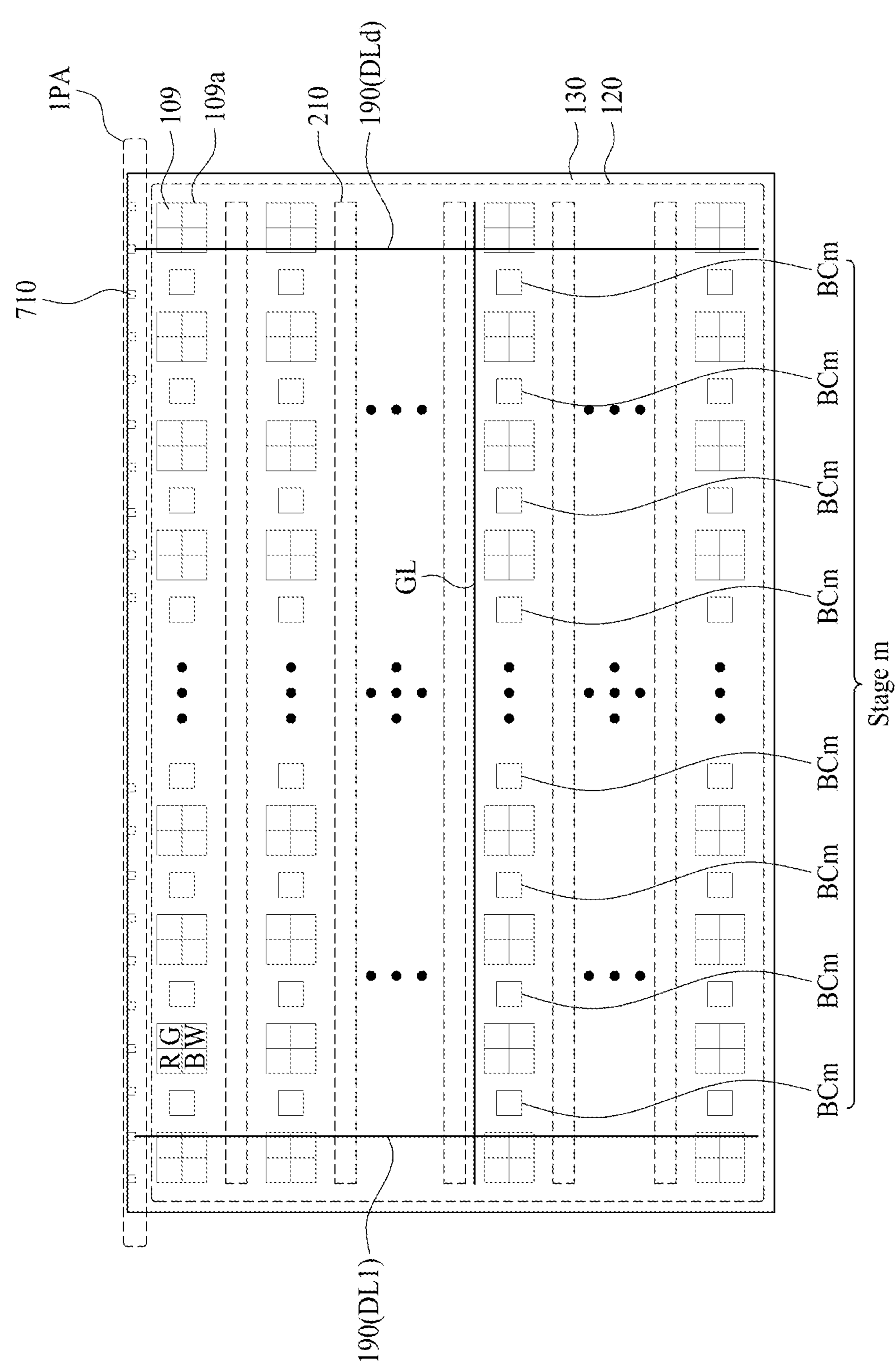
FIG. 5 is an example diagram illustrating a front surface of a light emitting display apparatus according to the present disclosure.

FIG. 5 is an example diagram illustrating a front surface of a light emitting display apparatus according to the present disclosure.

As described above, the light emitting display apparatus according to the present disclosure may include a first substrate 100, including pixels 109 and signal lines 190 arranged in a first direction, and a second substrate 600 which is disposed on a rear surface of the first substrate 100.

The signal lines 190 and the pixels 109 may be included in the first substrate 100. The signal lines 190 may include data lines DL1 to DLd which transfer data voltages to the pixels 109, power lines which transfer driving voltages to the pixels 109, gate clock lines which transfer gate clocks to a gate driver 200, and gate power lines which transfer gate driving voltages to the gate driver 200. Hereinafter, for convenience of description, as an example of the present disclosure, a light emitting display apparatus where the signal lines 190 are data lines will be described.

That is, as illustrated in FIGS. 3 and 5, the pixels 109 may be provided in the first substrate 100, and the data lines DL connected to the routing lines 710 through first pads may be provided in the first substrate 100. The first pads may be included in a first pad portion 1PA.

A gate driver 200 may include stages, for sequentially outputting gate pulses. Each of the stages may include a plurality of stage transistors. In some embodiments, the stage transistors may be provided in a display area 120 of the first substrate.

For example, as illustrated in FIG. 5, an $m^{th}$ stage Stage m configuring the gate driver 200 may include a plurality of $m^{th}$ branch circuit units BCm, and each of the $m^{th}$ branch circuit units BCm may include at least one stage transistor included in the $m^{th}$ stage Stage m. However, when the number of stage transistors included in the $m^{th}$ stage Stage m is less than the number of $m^{th}$ branch circuit units BCm, a stage transistor may not be included in at least one $m^{th}$ branch circuit unit BCm.

The $m^{th}$ branch circuit units BCm, as illustrated in FIG. 5, may be provided between unit pixels 109*a* configured with four pixels 109. For example, the unit pixel 109*a* may include a white pixel W, a red pixel R, a green pixel G, and a blue pixel B.

That is, the unit pixels 109*a* may be provided along a gate line GL arranged in a direction which differs from the data lines DL1 to DLd, and thus, the $m^{th}$ branch circuit units BCm may also be provided along the gate line GL.

In some embodiments, a stage line portion 210 including stage lines connected to the $m^{th}$ branch circuit units BCm may be provided along the gate line GL.

That is, in the light emitting display apparatus according to the present disclosure, the gate driver 200 may be provided in the display area 120 of the first substrate 100.

Moreover, gate clock lines which are connected to all stages and transfer gate clocks to all stages and gate power lines which transfer gate driving voltages to the gate driver 200 may be arranged in parallel with the data lines DL1 to DLd. The gate clock lines and the gate power lines may be connected to first pads. In some embodiments, the gate clock lines and the gate power lines may be included in the signal lines 190.

That is, in the light emitting display apparatus according to the present disclosure, various lines described above may be the signal lines 190.

In some embodiments, the signal lines 190 may be connected to routing lines 710 through the first pads included in the first pad portion 1PA.

The first pads may be connected to second pads included in a second pad portion 2PA of the second substrate 600 through the routing lines 710 provided at the first lateral surface 100LS of the first substrate 100 and the first lateral surface 600LS of the second substrate 600.

The link lines 690 connected to the second pads may be connected to the data driver 300, the controller 400, and the power supply 500, which are provided on a rear surface of the second substrate 600.

Hereinafter, a structure of a light emitting display apparatus according to the present disclosure will be described in detail with reference to FIGS. 1 to 7. In the following description, details which are the same or similar to details described above with reference to FIGS. 1 to 5 are omitted or will be briefly described.

Figure 6:
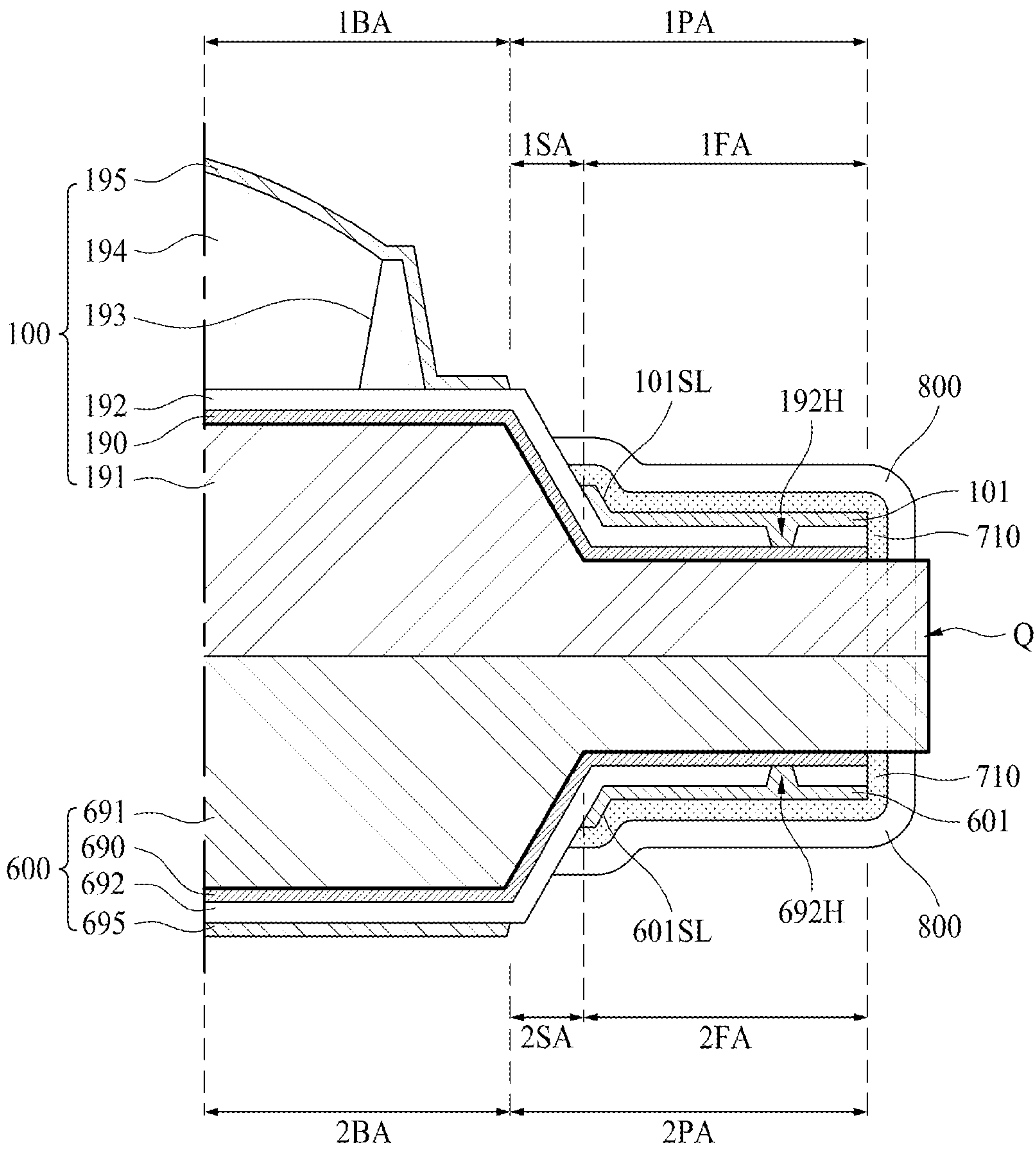
FIG. 6 is an example diagram illustrating a lateral surface of a K region illustrated in FIG. 3.
Figure 7:
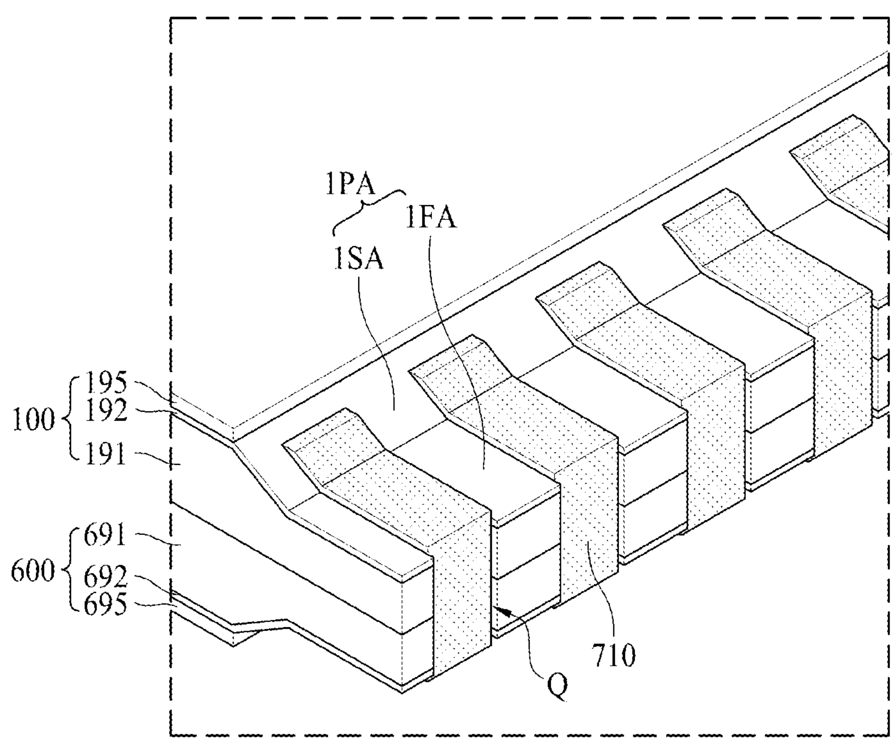
FIG. 7 is an enlarged example diagram of the K region illustrated in FIG. 3.

FIG. 6 is an example diagram illustrating a lateral surface of a K region illustrated in FIG. 3, and FIG. 7 is an enlarged example diagram of the K region illustrated in FIG. 3.

The light emitting display apparatus according to the present disclosure, as described herein, may include a first substrate 100 and a second substrate 600, and the first substrate 100 may be bonded to the second substrate 600 by a coupling member 900.

First, the first substrate 100 may include a first base substrate 191, and moreover, may include insulation layers, electrodes, signal lines 190, and light emitting devices ED, which are provided on the first base substrate 191.

For example, as illustrated in FIG. 6, the first substrate 100 may include the first base substrate 191, a signal line 190 provided on the first base substrate 191, a first insulation layer 192 covering the signal line 190, a dam 193 provided on the first insulation layer 192, an encapsulation layer 194 provided in a space surrounded by the first insulation layer 192 and the dam 193, and a first passivation layer 195 covering the encapsulation layer 194.

The first base substrate 191 may include a glass substrate, a plastic substrate, or a film.

The signal line 190, as described above, may be a data line DL.

The first insulation layer 192 may be at least one inorganic layer, at least one organic layer, or a combination layer of at least one inorganic layer and at least one organic layer.

Transistors and a capacitor configuring a pixel driving circuit PDC may be provided between the first base substrate 191 and the first insulation layer 192. That is, the first insulation layer 192 may perform a function of covering the transistors and the capacitor configuring the pixel driving circuit PDC. However, the first insulation layer 192 may be one of insulation layers configuring the transistors.

The light emitting device ED may be provided on the first insulation layer 192.

The signal line 190, as illustrated in FIG. 6, may be directly provided on the first base substrate 191, or may be provided on at least one insulation layer included in the first base substrate 191. Also, the signal line 190 may be provided on the first insulation layer 192, or may be provided on one of inorganic layers and organic layers configuring the first insulation layer 192. That is, the signal line 190 may be directly provided on the first base substrate 191, or may be provided on one of various insulation layers provided on the first base substrate 191.

The light emitting device ED may be covered by the encapsulation layer 194. The encapsulation layer 194 may be covered by the first passivation layer 195. The encapsulation layer 194 may block air or water entering from the outside, and thus, may protect the light emitting device ED.

The dam 193 for supporting the encapsulation layer 194 may be provided at an end of the encapsulation layer 194.

The encapsulation layer 194 and the dam 193 may be covered by the first passivation layer 195.

However, the first substrate 100 may be implemented in various structures in addition to a structure described above with reference to FIG. 6.

The second substrate 600 may be bonded to a rear surface of the first substrate 100 by the coupling member 900. Particularly, the second substrate 600 may be bonded to a rear surface of the first base substrate 191.

The second substrate 600 may include a second base substrate 691, and moreover, may include insulation layers and a link line 690, which are provided on the second base substrate 691.

For example, as illustrated in FIG. 6, the second substrate 600 may include the second base substrate 691, a link line 690 provided on the second base substrate 691, a second insulation layer 692 covering the link line 690, and a second passivation layer 695 covering the second insulation layer 692.

The second base substrate 691 may include a glass substrate, a plastic substrate, or a film.

The link line 690 may be connected to the data driver 300, the controller 400, or the power supply 500. The link line 690, as illustrated in FIG. 6, may be directly provided on the second base substrate 691, or may be provided on an insulation layer included in the second base substrate 691.

The second insulation layer 692 may be at least one inorganic layer, at least one organic layer, or a combination layer of at least one inorganic layer and at least one organic layer.

The second insulation layer 692 may be covered by the second passivation layer 695.

The first base substrate 191 may be divided into a first pad portion 1PA including a first pad 101 connected to the routing line 710, a display area 120 (not shown in FIG. 6), and a first boundary area 1BA provided between the display area 120 and the first pad portion 1PA.

That is, the first base substrate 191 may include the display area 120 and a non-display area 130 (FIG. 5), and the first boundary region 1BA and the first pad portion 1PA may be included in the non-display area 130.

In some embodiments, the first boundary region 1BA may be provided between the display area 120 and the first pad portion 1PA. In some embodiments, the first pad portion 1PA may be provided at an outermost portion of the first base substrate 191.

In some embodiments, the first pad portion 1PA may be provided at only one of four outer portions of the first base substrate 191. Therefore, only the first boundary region 1BA may be provided at three outer portions where the first pad portion 1PA is not provided. In some embodiments, a width of the non-display area 130 where the first pad portion 1PA is not provided may be less than that of the non-display area 130 where the first pad portion 1PA is provided.

The second base substrate 691 may include a second pad portion 2PA including a second pad 601 connected to the routing line 710, a connection region where the link line 690 is provided, and a second boundary region 2BA provided between the connection region and the second pad portion 2PA.

In some embodiments, the second boundary region 2BA may be extension of the connection region. The connection region and the second boundary region 2BA may not substantially be divided.

A thickness of the first base substrate 191 in the first pad portion 1PA may be less than that of the first base substrate 191 in the first boundary region 1BA. Also, a thickness of the second base substrate 691 in the second pad portion 2PA may be less than that of the second base substrate 691 in the second boundary region 2BA.

For example, as illustrated in FIGS. 6 and 7, the first pad portion 1PA may be provided in an engraved form at an outer portion of the first base substrate 191, and the second pad portion 2PA may be provided in an engraved form at an outer portion of the second base substrate 691.

That is, a flat surface of one of four outer portions of the first base substrate 191 may be etched to form a trench or a grave, and the first pad portion 1PA may be formed in the trench or grave. Also, a flat surface of one of four outer portions of the second base substrate 691 may be etched to form a trench or a grave, and the second pad portion 2PA may be formed in the trench or grave.

The first pad portion 1PA and the second pad portion 2PA may be formed by a mechanical process using a grinding device, or may be formed by a chemical process such as dry etching.

The first pad portion 1PA may include a first slope portion 1SA which is inclined from the first boundary region 1BA and a first flat portion 1FA which extends toward an end of the first base substrate 191 from the first slope portion 1SA.

The second pad portion 2PA may include a second slope portion 2SA which is inclined from the second boundary region 2BA and a second flat portion 2FA which extends toward an end of the second base substrate 691 from the second slope portion 2SA.

That is, a region of the first pad portion 1PA, which is adjacent to the first boundary region 1BA, may be formed to be inclined, and a region of the second pad portion 2PA, which is adjacent to the second boundary region 2BA, may be formed to be inclined.

A first pad 101 connected to the signal line 190 extending from the display area 120 may be provided at the first flat portion 1FA.

A second pad 601 connected to the link line 690 extending from the connection region may be provided at the second flat portion 2FA.

For example, as illustrated in FIG. 6, the first insulation layer 192 may be provided between the signal line 190 and the first pad 101, and the signal line 190 may be connected to the first pad 101 through a first contact hole 192H provided in the first insulation layer 192.

Moreover, the second insulation layer 692 may be provided between the link line 690 and the second pad 601, and the link line 690 may be connected to the second pad 601 through a second contact hole 692H provided in the second insulation layer 692.

The first pad 101 may be connected to the second pad 601 through the routing line 710.

Therefore, a signal supplied from the data driver 300, the controller 400, or the power supply 500 may be transferred to the routing line 710 through the link line 690 and the second pad 601, and a signal transferred through the routing line 710 may be transferred to pixels included in the first substrate 100 through the first pad 101 and the signal line 190.

In some embodiments, the first pad 101 provided at the first flat portion 1FA may extend to the first slope portion 1SA. In some embodiments, the first pad 101 may extend to an inclined surface of the first slope portion 1SA. In some embodiments, the first pad 101 may include a slope portion 101SL proximate to the first slope portion 1SA.

In some embodiments, the second pad 601 provided at the second flat portion 2FA may extend to the second slope portion 2SA. In some embodiments, the second pad 601 may extend to an inclined surface of the second slope portion 2SA. In some embodiments, the second pad 601 may include a slope portion 601SL proximate to the second slope portion 2SA.

In some embodiments, the routing line 710 may cover the first pad 101 and the second pad 601 extending to the first slope portion 1SA and the second slope portion 2SA. In some embodiments, the routing line 710 may cover the first slope portion 101SL of the first pad 101 and cover the second slope portion 601SL of the second pad 601.

Therefore, a contact area between the routing line 710 and the first pad 101 may increase, and a contact area between the routing line 710 and the second pad 601 may increase.

In some embodiments, the routing line 710 may completely contact the first pad 101 and the second pad 601.

Moreover, because an area or a length of each of the first pad 101 and the second pad 601 increases, an electrical resistance may decrease in connecting the routing line 710 to the first pad 101, and an electrical resistance may decrease in connecting the routing line 710 to the second pad 601.

For example, comparing with a case where the first slope portion 1SA is provided in a flat shape, a length of the first pad 101 may be more increased by an inclined surface of the first slope portion 1SA, and comparing with a case where the second slope portion 2SA is provided in a flat shape, a length of the second pad 601 may be more increased by an inclined surface of the second slope portion 2SA.

Accordingly, comparing with a case where each of the first slope portion 1SA and the second slope portion 2SA is provided in a flat shape, a length of the first pad 101 and a length of the second pad 601 may more increase or may be equal despite a reduction in width of each of the first pad portion 1PA and the second pad portion 2PA.

According to the present disclosure, a width of each of the first pad portion 1PA and the second pad portion 2PA may decrease compared to the related art, and thus, a width of the non-display area 130 may decrease compared to the related art. Also, according to the present disclosure, a contact area or a contact length between the first pad 101, the second pad 601, and the routing line 710 may increase compared to the related art, and thus, an electrical characteristic of each of the first pad 101, the second pad 601, and the routing line 710 may be enhanced.

A sum of a thickness of the first base substrate 191, a thickness of the signal line 190, a thickness of the first insulation layer 192, a thickness of the first pad 101, and a thickness of the routing line 710 in the first flat portion 1FA and a thickness of the second base substrate 691, a thickness of the link line 690, a thickness of the second insulation layer 692, a thickness of the second pad 601, and a thickness of the routing line 710 in the second flat portion 2FA may be set to be less than or equal to a sum of a thickness of the first base substrate 191 in the first boundary region 1BA and a thickness of the second base substrate 691 in the second boundary region 2BA.

In order to protect the routing line 710, the routing line 710 may be covered by a coating layer 800. In some embodiments, even when a thickness of the coating layer 710 is added to a total thickness of elements provided in the first flat portion 1FA and the second flat portion 2FA, a total thickness may be set to be less than or equal to a sum of a thickness of the first base substrate 191 in the first boundary region 1BA and a thickness of the second base substrate 691 in the second boundary region 2BA.

Accordingly, a phenomenon where the routing line 710 provided in the first flat portion 1FA and the second flat portion 2FA is swept by surfaces of various devices may be prevented, and thus, a defect rate of the routing line 710 may decrease.

In some embodiments, even when a total thickness of elements provided in the first flat portion 1FA and the second flat portion 2FA is set to be slightly greater than a sum of a thickness of the first base substrate 191 in the first boundary region 1BA and a thickness of the second base substrate 691 in the second boundary region 2BA, a total thickness may be set to be less than or equal to a thickness of all layers provided in the first boundary region 1BA and the second boundary region 2BA, on the basis of various layers provided in the first boundary region 1BA and the second boundary region 2BA. Accordingly, a phenomenon where the routing line 710 is swept by surfaces of various devices may be prevented, and thus, a defect rate of the routing line 710 may decrease.

That is, a total thickness in the first flat portion 1FA and the second flat portion 2FA may be set to be less than or equal to a thickness of the first base substrate 191 in the first boundary region 1BA and a thickness of the second base substrate 691 in the second boundary region 2BA.

Finally, as illustrated in FIGS. 6 and 7, a lateral engraved pattern Q into which the routing line 710 is inserted may be formed in each of a first lateral surface 191LS of the first base substrate 191 and a first lateral surface 691LS of the second base substrate 691.

In some embodiments, a depth of the lateral engraved pattern Q may be set to be greater than or equal to a thickness of the routing line 710.

Also, a depth of the lateral engraved pattern Q may be set to be greater than or equal to a sum of a thickness of the routing line 710 and a thickness of the coating layer 800. As such, the routing line 710 and the coating layer 800 are fully embedded in the lateral engraved pattern Q, and a lateral surface of each of the first base substrate 191 and the second base substrate 691 extends beyond the routing line 710 and the costing layer 800.

Therefore, even when a lateral surface of the light emitting display apparatus (e.g., the first lateral surface 191LS of the first base substrate 191 and the first lateral surface 691LS of the second base substrate 691) are closely adhered to surfaces of various devices, a phenomenon where the routing line 710 is swept may be prevented. Accordingly, a defect rate of the routing line 710 may decrease.

Figure 8:
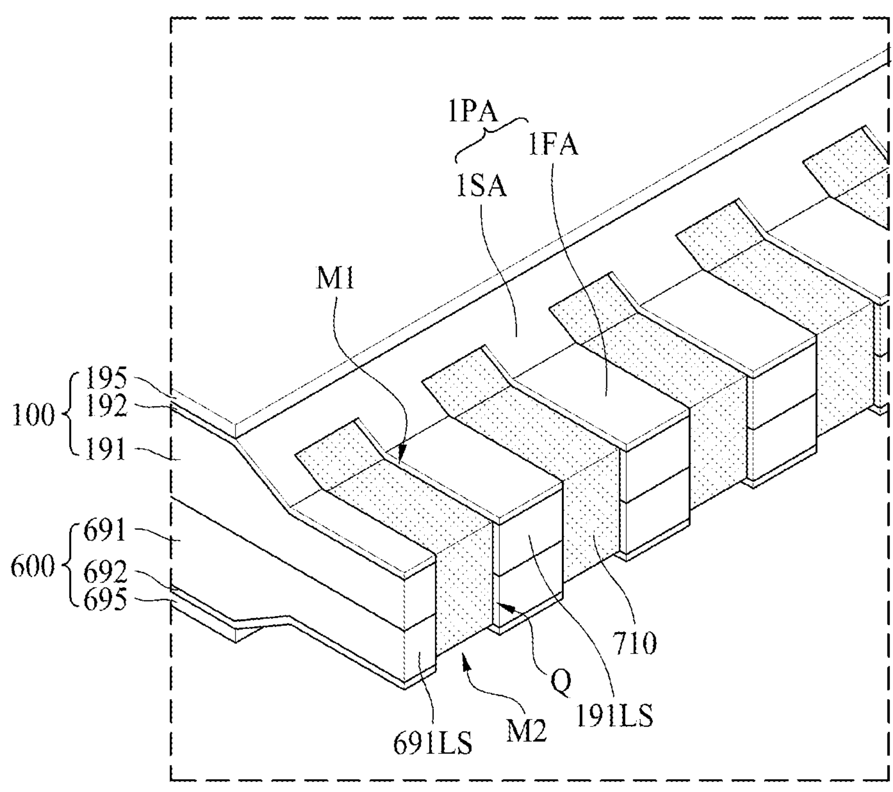
FIG. 8 is another enlarged example diagram of the K region illustrated in FIG. 3.

FIG. 8 is another enlarged example diagram of the K region illustrated in FIG. 3. In the following description, details which are the same or similar to details described above with reference to FIGS. 1 to 7 are omitted or will be briefly described.

Hereinabove, as described above with reference to FIGS. 6 and 7, a lateral engraved pattern Q into which the routing line 710 is inserted may be formed in each of a first lateral surface 191LS of the first base substrate 191 and a first lateral surface 691LS of the second base substrate 691 to which the routing line 710 extends.

An engraved pattern having a function similar to the lateral engraved pattern Q may be formed in a first pad portion 1PA and a second pad portion 2PA.

That is, as illustrated in FIG. 8, a first flat engraved pattern M1 into which the routing line 710 is inserted may be formed in a first flat surface of the first base substrate 191 including the first pad portion 1PA, and a second flat engraved pattern M2 into which the routing line 710 is inserted may be formed in a first flat surface of the second base substrate 691 including the second pad portion 2PA.

The first flat engraved pattern M1 may be provided in a first slope portion 1SA and a first flat portion 1FA, and the second flat engraved pattern M2 may be provided in a second slope portion 2SA and a second flat portion 2FA. That is, the first flat engraved pattern M1 may be provided in a region, corresponding to the first slope portion 1SA and the first flat portion 1FA, of the first base substrate 191, and the second flat engraved pattern M2 may be provided in a region, corresponding to the second slope portion 2SA and the second flat portion 2FA, of the second base substrate 691.

A signal line 190 extending from a display area 120, a first insulation layer 192 covering the signal line 190, a first pad 101 connected to the signal line 190 through the first insulation layer 192, and a routing line 710 may be provided in the first flat engraved pattern M1.

A link line 690 extending from a connection region, a second insulation layer 692 covering the link line 690, a second pad 601 connected to the link line 690 through the second insulation layer 692, and a routing line 710 may be provided in the second flat engraved pattern M2.

In some embodiments, a depth of the first flat engraved pattern M1 and a depth of the second flat engraved pattern M2 may be set so that the routing line 710 or the coating layer 800 provided in the first flat engraved pattern M1 and the second flat engraved pattern M2 does not protrude to the outside of the first flat engraved pattern M1 and the second flat engraved pattern M2.

Accordingly, according to the present disclosure described herein, a phenomenon where the routing line 710 is swept by various devices may be prevented, and thus, a defect rate of the routing line 710 may decrease.

Figure 9:
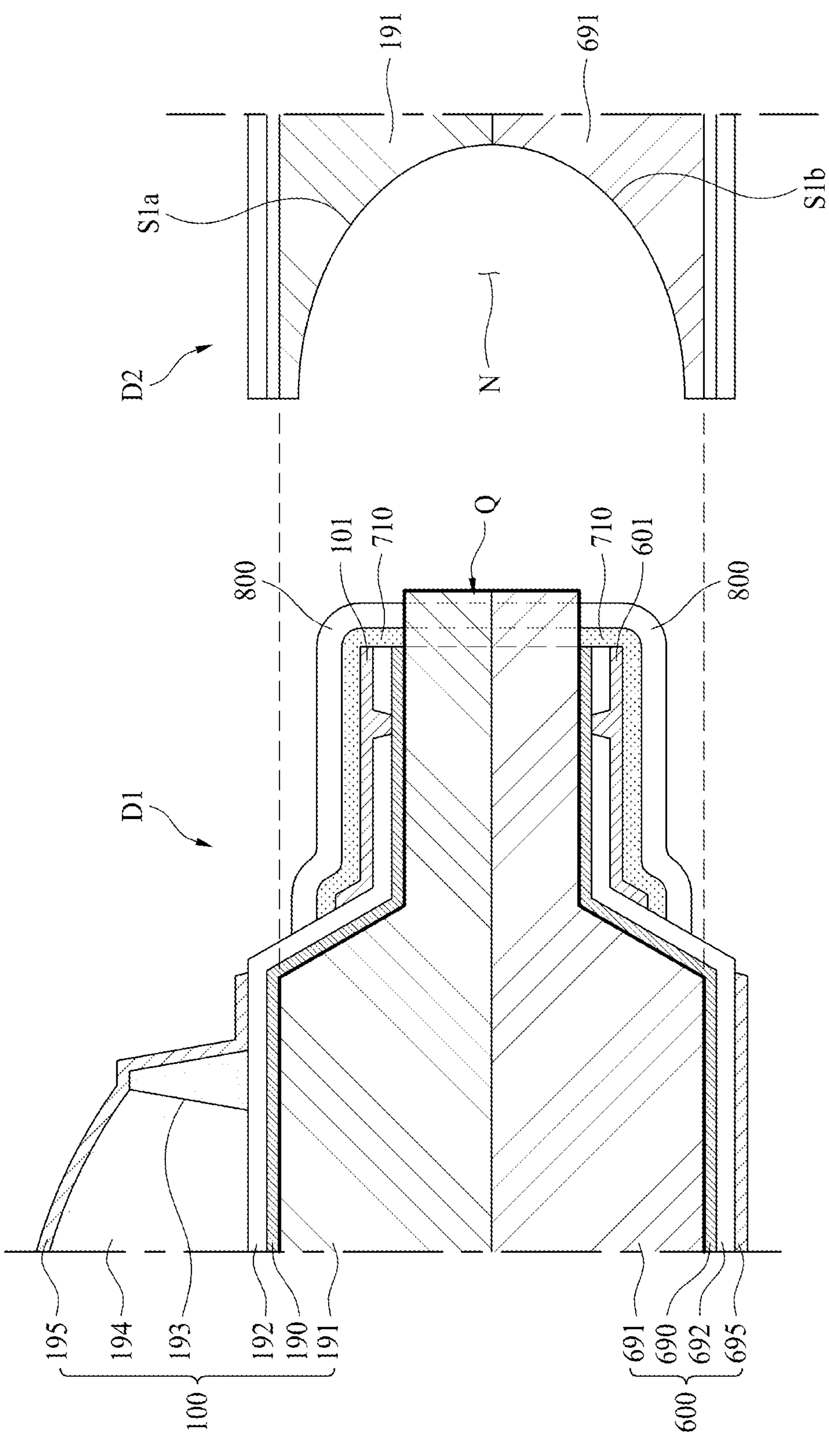
FIG. 9 is another example diagram illustrating the lateral surface of the K region illustrated in FIG. 3.

FIG. 9 is another example diagram illustrating the lateral surface of the K region illustrated in FIG. 3.

As described above, a total thickness in a first flat portion 1FA and a second flat portion 2FA may be less than or equal to a sum of a thickness of a first base substrate 191 in a first boundary region 1BA and a thickness of a second base substrate 691 in a second boundary region 2BA.

In some embodiments, as illustrated in FIG. 9, an insertion engraved pattern N may be formed in a second lateral surface Sla, which differs from a first lateral surface adjacent to a first pad portion 1PA, of lateral surfaces of the first base substrate 191 and a second lateral surface S1*b*, which differs from a first lateral surface adjacent to a second pad portion 2PA, of lateral surfaces of the second base substrate 691. Here, the second lateral surface of the first base substrate 191 may be a lateral surface, which is opposite to (or faces) the first lateral surface 191LS, of the first base substrate 191, may be a lateral surface, which is adjacent to the first lateral surface 191LS, of the first base substrate 191, or may be a lateral surface, which is apart from the first lateral surface 191LS, of the first base substrate 191. Also, the second lateral surface 691LS of the second base substrate 691 may be a lateral surface, which is opposite to (or faces) the first lateral surface 691LS, of the second base substrate 691, may be a lateral surface, which is adjacent to the first lateral surface 691LS, of the second base substrate 691, or may be a lateral surface, which is apart from the first lateral surface 691LS, of the second base substrate 691.

To provide an additional description, the first pad portion 1PA and the second pad portion 2PA may be provided at a first lateral surface of one light emitting display apparatus, and the insertion engraved pattern N concavely recessed into the second lateral surfaces may be provided in the second lateral surfaces.

Therefore, in a case where two light emitting display apparatuses D1 and D2 according to the present disclosure including the first pad portion 1PA, the second pad portion 2PA, and the insertion engraved pattern N are closely adhered to each other to form one large screen, a region including the first pad portion 1PA and the second pad portion 2PA in a first light emitting display apparatus D1 may be inserted into the insertion engraved pattern N of a second light emitting display apparatus D2.

In some embodiments, a portion of a non-display area 130 of the first light emitting display apparatus D1 may overlap a portion of a non-display area 130 of the second light emitting display apparatus D2. Therefore, a width of a non-display area shown between the first light emitting display apparatus D1 and the second light emitting display apparatus D2 closely adhered to each other may be reduced. Accordingly, the immersion of a user may increase.

According to the present disclosure, routing lines may not directly contact various devices and structures, and thus, damage of the routing lines may be prevented.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus comprising:

a first base substrate including a first pad portion, a display area, and a first boundary region between the display area and the first pad portion, the first pad portion including a first pad connected to a routing line; and a second base substrate including a second pad portion and a second boundary region connected to the second pad portion, the second pad portion including a second pad connected to the routing line;

wherein:

the second base substrate is bonded to a rear surface of the first base substrate, a thickness of the first base substrate in the first pad portion is less than a thickness of the first base substrate in the first boundary region, and a thickness of the second base substrate in the second pad portion is less than a thickness of the second base substrate in the second boundary region, and wherein the first pad portion comprises:

a first slope portion inclined from the first boundary region; and a first flat portion extending toward an end of the first base substrate from the first slope portion, and the second pad portion comprises:

a second slope portion inclined from the second boundary region; and a second flat portion extending toward an end of the second base substrate from the second slope portion.

2. The light emitting display apparatus of claim 1, wherein the first pad is connected to a signal line extending from the display area, the second pad is connected to a link line extending from the second boundary region, and the first pad is connected to the second pad through the routing line.

3. The light emitting display apparatus of claim 2, wherein the first pad extends to the first slope portion, the second pad extends to the second slope portion, and the routing line covers the first pad and the second pad respectively extending to the first slope portion and the second slope portion.

4. The light emitting display apparatus of claim 2, wherein a first insulation layer is provided between the signal line and the first pad and the signal line is connected to the first pad through a first contact hole provided in the first insulation layer, and a second insulation layer is provided between the link line and the second pad and the link line is connected to the second pad through a second contact hole provided in the second insulation layer.

5. The light emitting display apparatus of claim 4, wherein a sum of a thickness of the first base substrate, a thickness of the signal line, a thickness of the first insulation layer, a thickness of the first pad, and a thickness of the routing line in the first flat portion and a thickness of the second base substrate, a thickness of the link line, a thickness of the second insulation layer, a thickness of the second pad, and a thickness of the routing line in the second flat portion is set to be less than or equal to a sum of a thickness of the first base substrate and a thickness of the second base substrate in the first boundary region and the second boundary region.

6. The light emitting display apparatus of claim 1, wherein the routing line connected to the first pad extends to the second pad portion and is connected to the second pad through a first lateral surface of the first base substrate and a first lateral surface of the second base substrate, and wherein each of the first lateral surface of the first base substrate and the first lateral surface of the second base substrate includes a lateral engraved pattern, and the routing line extends in the lateral engraved pattern in each of the first lateral surface of the first base substrate and the first lateral surface of the second base substrate.

7. The light emitting display apparatus of claim 1, wherein the first base substrate includes a first flat engraved pattern in the first slope portion and the first flat portion of the first base substrate, and the second based substrate includes a second flat engraved pattern in the second slope portion and the second flat portion of the second base substrate.

8. The light emitting display apparatus of claim 7, comprising:

a signal line extending from the display area and a first insulation layer covering the signal line, the signal line connected to the first pad through a contact hole in the first insulation layer, wherein the signal line, the first insulation layer, the routing line and the first pad extend in the first flat engraved pattern; and a second insulation layer covering the link line, the second pad connected to the link line through a contact hole in the second insulation layer, wherein the link line, the second insulation layer, the routing line and the second pad extend in the second flat engraved pattern.

9. The light emitting display apparatus of claim 1, wherein a second lateral surface is opposite to a first lateral surface adjacent to the first pad portion among lateral surfaces of the first base substrate, a second lateral surface is opposite to a first lateral surface adjacent to the second pad portion among lateral surfaces of the second base substrate, and an insertion engraved pattern concavely recessed into the second lateral surfaces of the first base substrate and the second base substrate is formed in the second lateral surfaces.

10. The light emitting display apparatus of claim 5, comprising a coating layer that covers the routing line, wherein a sum of the thickness of the first base substrate, the thickness of the signal line, the thickness of the first insulation layer, the thickness of the first pad, the thickness of the routing line, and a thickness of the coating layer in the first flat portion and the thickness of the second base substrate, the thickness of the link line, the thickness of the second insulation layer, the thickness of the second pad, the thickness of the routing line, and a thickness of the coating layer in the second flat portion is less than or equal to a sum of the thickness of the first base substrate and the thickness of the second base substrate in the first boundary region and the second boundary region.

11. A light emitting display apparatus comprising:

a first body including a first central area, a first pad portion, and a first boundary region between the first central area and the first pad portion, the first pad portion including a first flat portion and a first slope portion between the first boundary region and the first flat portion on a first surface of the first pad portion, a thickness of the first body in the first flat portion of the first pad portion is less than a thickness of the first body in the first boundary region;

a first pad on the first flat portion of the first pad portion;

a routing line extending on the first surface of the first pad portion and on a first lateral surface of the first pad portion that meets the first surface, the routing line in contact with the first pad, and a second body including a second central area, a second pad portion, and a second boundary region between the second central area and the second pad portion, the second pad portion including a second flat portion and a second slope portion between the second boundary region and the second flat portion on a first surface of the second pad portion, a thickness of the second body in the second flat portion of the second pad portion is less than a thickness of the second body in the second boundary region, wherein the second body has a rear surface bonded to a rear surface of the first body.

12. The light emitting display apparatus of claim 11, wherein the first pad includes a slope portion proximate to the first boundary region first boundary region.

13. The light emitting display apparatus of claim 12, wherein the routing line is in contact with the slope portion of the first pad.

14. The light emitting display apparatus of claim 11, wherein the routing line is on the first pad.

15. The light emitting display apparatus of claim 11, wherein the first lateral surface of the first pad portion includes a lateral engraved pattern, and the routing line is in the lateral engraved pattern.

16. The light emitting display apparatus of claim 15, wherein the first lateral surface of the first pad portion extends beyond the routing line.

17. A light emitting display apparatus comprising:

a first base substrate including a first pad portion, a display area, and a first boundary region between the display area and the first pad portion, the first pad portion including a first engraved pattern that extends along a front surface and an edge surface of the first pad portion; and a second base substrate having a rear surface bonded to a rear surface of the first base substrate, the second base substrate including a second pad portion and a second boundary region connected to the second pad portion, the second pad portion including a second engraved pattern that extends along a front surface and an edge surface of the second pad portion, the second engraved pattern in communication with the first trench;

a first pad in the first engraved pattern;

a second pad in the second engraved pattern; and a routing line in both the first engraved pattern and the second engraved pattern and in contact with both the first pad and the second pad, wherein the first pad includes a slope portion proximate to the first boundary region, and the routing line is on and in contact with the slope portion of the first pad.

18. The light emitting display apparatus of claim 17, wherein the routing line is fully embedding in the first trench and the second trench along the edge surfaces of the first pad portion and the second pad portion.

* * * * *